US012578628B2

(12) United States Patent
Matsumoto et al.

(10) Patent No.: US 12,578,628 B2
(45) Date of Patent: Mar. 17, 2026

(54) IMAGE CAPTURING UNIT

(71) Applicant: Panasonic Intellectual Property Management Co., Ltd., Osaka (JP)

(72) Inventors: Yasutaka Matsumoto, Tokyo (JP); Yoshiyuki Hashimoto, Kanagawa (JP); Kazuhiro Abe, Tokyo (JP); Kiyohiko Yamada, Kanagawa (JP); Wataru Takahashi, Kanagawa (JP)

(73) Assignee: Panasonic Automotive Systems Co., Ltd., Kanagawa (JP)

( * ) Notice: Subject to any disclaimer, the term of this patent is extended or adjusted under 35 U.S.C. 154(b) by 161 days.

(21) Appl. No.: 18/495,603

(22) Filed: Oct. 26, 2023

(65) Prior Publication Data

US 2024/0053663 A1 Feb. 15, 2024

Related U.S. Application Data

(63) Continuation of application No. 18/249,903, filed as application No. PCT/JP2021/040386 on Nov. 2, 2021, now abandoned.

(30) Foreign Application Priority Data

Feb. 12, 2021 (JP) ................................ 2021-021250

(51) Int. Cl.
*G03B 17/55* (2021.01)
*G03B 30/00* (2021.01)
(Continued)

(52) U.S. Cl.
CPC .............. *G03B 17/55* (2013.01); *H04N 23/52* (2023.01); *H05K 7/2039* (2013.01); *G03B 30/00* (2021.01)

(58) Field of Classification Search
CPC ...... G08B 13/196–19697; H04N 23/57; G03B 17/55; G03B 30/00
See application file for complete search history.

(56) References Cited

U.S. PATENT DOCUMENTS 9,179,053 B2 * 11/2015 Takeshita ................ H04N 23/57
9,300,848 B2 * 3/2016 Mano ...................... H04N 23/55
(Continued)

FOREIGN PATENT DOCUMENTS

JP 2010173540 A 8/2010
JP 2011246056 A 12/2011
(Continued)

OTHER PUBLICATIONS

English Translation of International Search Report, mailed Jan. 11, 2022, for International Patent Application No. PCT/JP2021/040386. (3 pages).

*Primary Examiner* — Leon W Rhodes, Jr.
(74) *Attorney, Agent, or Firm* — Seed Intellectual Property Law Group LLP

(57) ABSTRACT

An image capturing unit according to an embodiment of the present disclosure includes a camera, a bracket, a heat-dissipation part, and a coupling part. The camera is housed in a metal case. The bracket is formed of resin and configured to support the camera. The heat-dissipation part is disposed on a rear side of the camera and configured to dissipate heat of the camera. The coupling part is formed of metal and configured to couple the case of the camera and the heat-dissipation part to each other.

12 Claims, 5 Drawing Sheets

(51) Int. Cl.
    *H04N 23/52*        (2023.01)
    *H05K 7/20*         (2006.01)

(56)           References Cited

U.S. PATENT DOCUMENTS

| | | | |
|---|---|---|---|
| 9,896,039 B2 | 2/2018 | Achenbach et al. | |
| 10,214,157 B2 | 2/2019 | Achenbach et al. | |
| 10,216,067 B2 * | 2/2019 | Chen | H04N 23/52 |
| 10,382,725 B2 * | 8/2019 | Jung | H04N 7/183 |
| 10,683,962 B2 * | 6/2020 | Raghupathy | F16M 11/105 |
| 2010/0196000 A1 | 8/2010 | Watanabe | |
| 2015/0029337 A1 | 1/2015 | Uchiyama et al. | |
| 2017/0129418 A1 | 5/2017 | Koshiba et al. | |
| 2018/0281696 A1 | 10/2018 | Uchiyama et al. | |
| 2020/0059583 A1 * | 2/2020 | Tamura | H04N 23/54 |

FOREIGN PATENT DOCUMENTS

| | | | |
|---|---|---|---|
| JP | 2013135405 A | 7/2013 | |
| JP | 2015026568 A | 2/2015 | |
| JP | 2017040723 A | 2/2017 | |
| JP | 6234572 B2 | 11/2017 | |
| JP | 2018042218 A | 3/2018 | |
| JP | 2018167610 A | 11/2018 | |
| JP | 2019220923 A | 12/2019 | |
| WO | WO 2020149085 A1 | 7/2020 | |

* cited by examiner

1

56

55

40

30

34

32

54

51

31

33

52

53

20

10

11

113

X

Y

Z

IMAGE CAPTURING UNIT

CROSS-REFERENCE TO RELATED APPLICATIONS

This application is a U.S. continuation application of U.S. patent application Ser. No. 18/249,903, filed Apr. 20, 2023, which is a 371 U.S. national phase application of PCT International Application No. PCT/JP2021/040386, filed on Nov. 2, 2021, which claims the benefit of priority of the prior Japanese Patent Application No. 2021-021250, filed on Feb. 12, 2021, the entire contents of which are incorporated herein by reference.

FIELD

Embodiments described herein relate generally to an image capturing unit.

BACKGROUND

Conventionally, a vehicle such as an automobile or a tractor is provided with an in-vehicle camera attached outside the vehicle. Such an in-vehicle camera is provided with an Image Signal Processor (ISP), which executes image processing such as detection of vehicles, pedestrians, and obstacles. The in-vehicle camera is demanded to dissipate heat more efficiently since the amount of heat generation increases as the function of the ISP advances. Conventional technologies are described in JP 6234572 B2, JP 2011-246056 A, JP 2017-40723 A, JP 2018-42218 A, U.S. Pat. Nos. 10,214,157, and 9,896,039, for example.

SUMMARY

An image capturing unit according to an embodiment of the present disclosure includes a camera, a bracket, a heat-dissipation part, and a coupling part. The camera is housed in a metal case. The bracket is formed of resin and configured to support the camera. The heat-dissipation part is disposed on a rear side of the camera and configured to dissipate heat of the camera. The coupling part is formed of metal and configured to couple the case of the camera and the heat-dissipation part to each other.

DETAILED DESCRIPTION

Hereinafter, an embodiment of the present disclosure will be described in detail with appropriate reference to the accompanying drawings. However, unnecessarily detailed descriptions may be omitted. Note that the accompanying drawings and the following descriptions are provided for a person skilled in the art to sufficiently understand the present disclosure and are not intended to limit the gist described in claims.

First Embodiment

Figure 1:
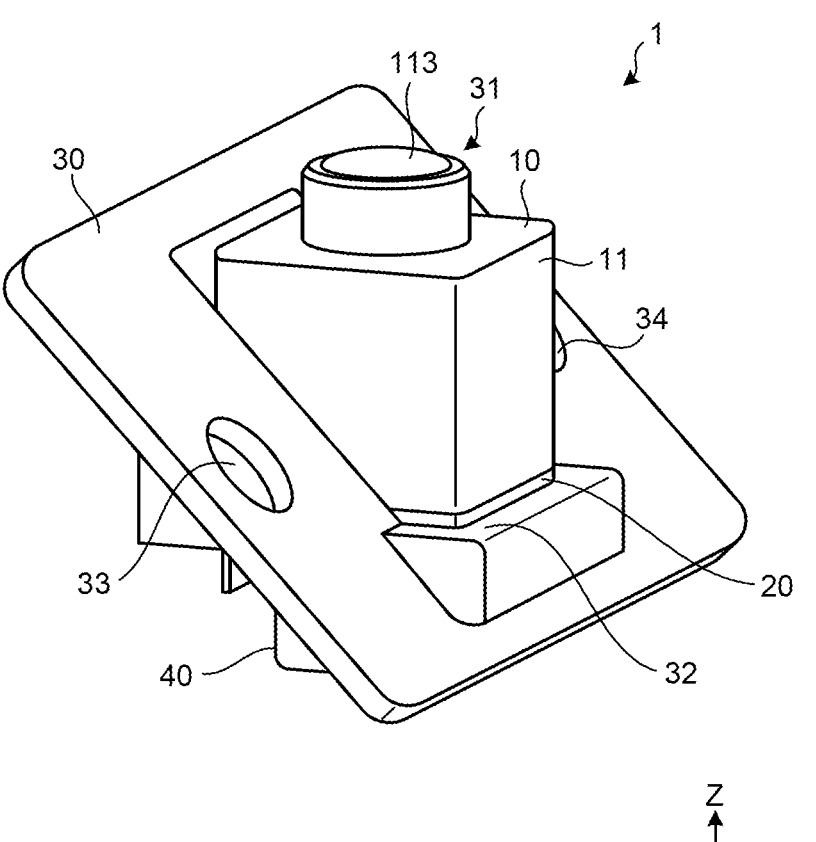
FIG. 1 is a perspective view illustrating an example of an external appearance of an image capturing unit according to a first embodiment.
Figure 2:
FIG. 2 is an exploded perspective view illustrating an example of an exploded state of the image capturing unit according to the first embodiment.
Figure 3:
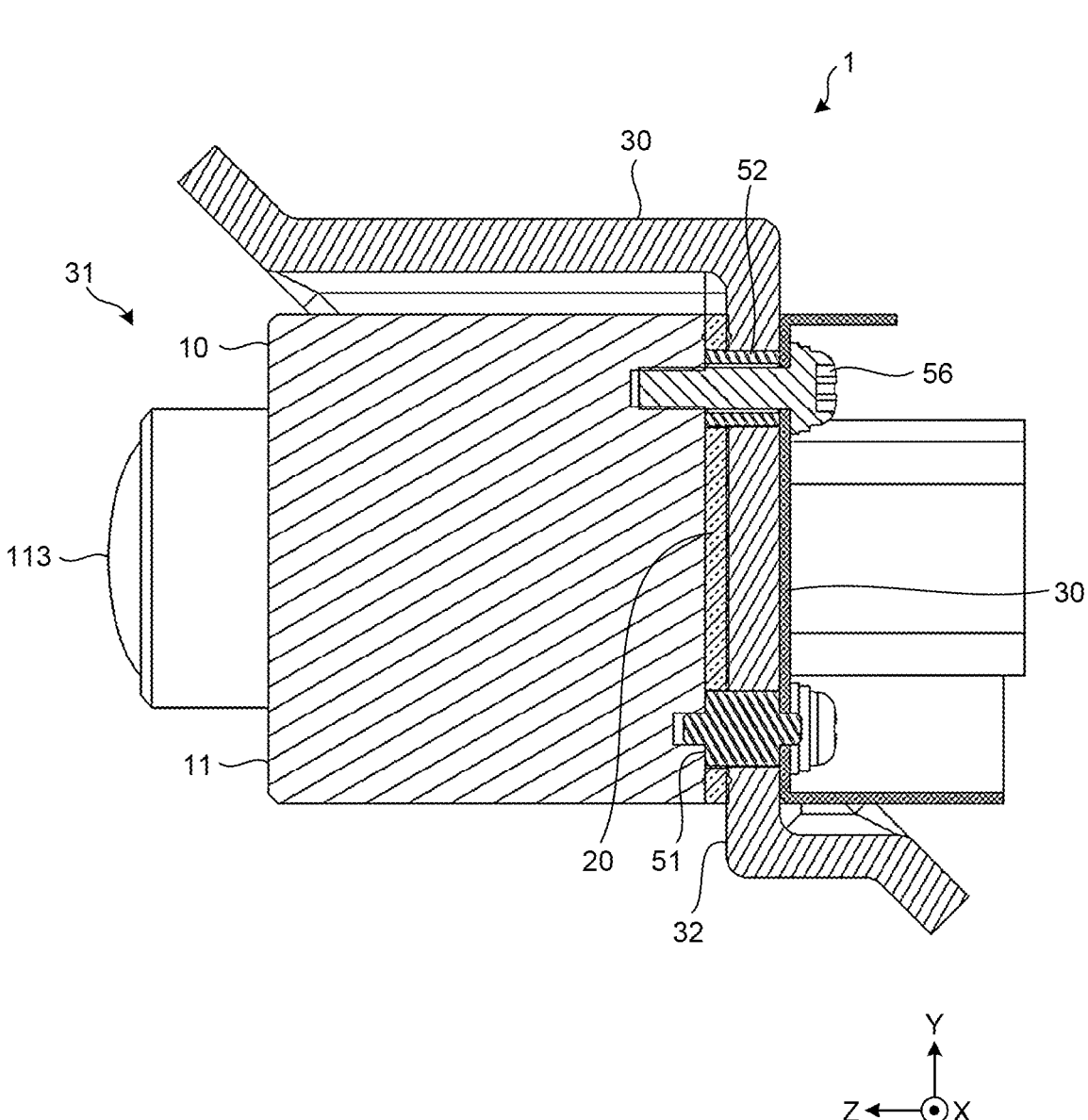
FIG. 3 is a cross-sectional view illustrating an example of a sectioned state of the image capturing unit according to the first embodiment.

FIG. 1 is a perspective view illustrating an example of an external appearance of an image capturing unit 1 according to a first embodiment. FIG. 2 is an exploded perspective view illustrating an example of an exploded state of the image capturing unit 1 according to the first embodiment. FIG. 3 is a cross-sectional view illustrating an example of a sectioned state of the image capturing unit 1 according to the first embodiment.

In the present embodiment, an orthogonal coordinate system including an X-axis, a Y-axis, and a Z-axis is defined. The Z-axis direction is the direction parallel to an optical axis direction of an image capturing device 10. The X-axis direction is the direction orthogonal to the Z-axis direction and connecting a first opening 33 and a second opening 34. The Y-axis direction is the direction orthogonal to the X-axis direction and the Z-axis direction. Also, the direction in which a lens 113 of the image capturing device 10 is disposed will be referred to as a front side, and the direction which is the direction in which a heat-dissipation part 40 is disposed and is opposed to the front side will be referred to as a rear side.

The image capturing unit 1 is attached to a vehicle such as an automobile or a truck. The image capturing unit 1 is provided with the image capturing device 10, a bracket packing 20, a bracket 30, a heat-dissipation part 40, a first pin 51, a second pin 52, a first sleeve 53, a second sleeve 54, a first screw 55, and a second screw 56.

The image capturing device 10 is a camera housed in a metal case 11. For example, the case 11 is formed of aluminum.

The bracket packing 20 is disposed between the image capturing device 10 and the bracket 30. For example, the bracket packing 20 is formed of rubber. The bracket packing 20 is a member which enhances the sealing between the image capturing device 10 and the bracket 30. In other words, the bracket packing 20 restricts intrusion of water from between the image capturing device 10 and the bracket 30.

The bracket 30 is a member which is formed of a resin and supports the image capturing device 10. In more detail, the bracket 30 has a recessed portion 31 in which the image capturing device 10 fits. The recessed portion 31 has, on a coupling surface 32 which contacts a surface of the rear side of the image capturing device 10, holes in which the first pin 51, the second pin 52, the first sleeve 53, and the second sleeve 54 are inserted and a hole in which a rear-face connector 171 (see FIG. 4) is inserted. Similarly, the bracket packing 20 has, at the positions corresponding to the holes of the coupling surface 32, holes in which the first pin 51, the second pin 52, the first sleeve 53, and the second sleeve 54 are inserted and a hole in which the rear-face connector 171 (see FIG. 4) is inserted.

Also, the bracket 30 has the first opening 33 and the second opening 34 on the sides of the recessed portion 31. The first opening 33 and the second opening 34 are openings in which fixing members such as screws are inserted. The image capturing unit 1 is coupled to a vehicle by the fixing members inserted in the first opening 33 and the second opening 34. Herein, the bracket 30 is formed of an insulator such as a resin. On the other hand, the image capturing device 10 is housed in the metal case 11. The bracket 30 is formed of a resin in order to prevent a current from flowing also to the image capturing device 10 via the case 11 if the current flows to the vehicle, for example, due to lightning.

The heat-dissipation part 40 is disposed on the rear side of the image capturing device 10 and dissipates the heat of the image capturing device 10. In more detail, the heat-dissipation part 40 is disposed at a position corresponding to the recessed portion 31. In other words, at the recessed portion 31, the heat-dissipation part 40 is disposed on the opposite side of the image capturing device 10. The heat-dissipation part 40 is formed of metal having a high heat transfer rate such as aluminum. Also, the heat-dissipation part 40 has a plurality of plates extending from edges thereof toward the rear side. The heat-dissipation part 40 dissipates heat from the plurality of plates.

The first pin 51, the second pin 52, the first sleeve 53, the second sleeve 54, the first screw 55, and the second screw 56 are formed of metal and couple the case 11 of the image capturing device 10 and the heat-dissipation part 40 to each other. For example, the first pin 51, the second pin 52, the first sleeve 53, the second sleeve 54, the first screw 55, and the second screw 56 are an example of a coupling part. The first pin 51, the second pin 52, the first sleeve 53, the second sleeve 54, the first screw 55, and the second screw 56 couple the case 11 of the image capturing device 10 and the heat-dissipation part 40 by one or more screw(s) and one or more pin(s) disposed on a diagonal line(s) of the coupling surface 32, which couples the case 11 and the heat-dissipation part 40.

In more detail, the first pin 51 and the second pin 52 pierce into the holes provided on the case 11 of the image capturing device 10, the bracket packing 20, the bracket 30, and the heat-dissipation part 40. As a result, the first pin 51 and the second pin 52 fix the case 11 of the image capturing device 10, the bracket packing 20, the bracket 30, and the heat-dissipation part 40. Also, the first pin 51 and the second pin 52 are inserted in the holes on the diagonal line among the four holes provided at four corners of the coupling surface 32.

The first sleeve 53 and the second sleeve 54 are tubular members which have through-holes. The first screw 55 and the second screw 56 are rod-like members which have helical grooves. The first screw 55 and the second screw 56 are inserted in the first sleeve 53 and the second sleeve 54. The first sleeve 53 and the second sleeve 54 are inserted in the holes in which the first pin 51 and the second pin 52 are not provided. In other words, the first sleeve 53 and the second sleeve 54 are inserted in the holes on the diagonal line among the four holes provided at the four corners of the coupling surface 32. The first screw 55 and the second screw 56 penetrate through the first sleeve 53 or the second sleeve 54 and fix the case 11 of the image capturing device 10, which has holes provided with helical grooves disposed on diagonal lines, to the bracket 30.

Herein, if all of the four corners of the coupling surface 32 are fixed to the case 11 of the image capturing device 10 with sleeves and screws, the attachment angle of the image capturing device 10 may be misaligned since distal ends of the sleeves are flat surfaces. In such a case, the image capturing device 10 captures tilted images. On the other hand, the first pin 51 and the second pin 52 have raised projections at the distal ends thereof. By mating with the case 11 of the image capturing device 10, which has the holes disposed on the diagonal line, to carry out positioning, the projections can reduce the probability that the attachment angle of the image capturing device 10 is misaligned.

Also, the first pin 51, the second pin 52, the first sleeve 53, the second sleeve 54, the first screw 55, and the second screw 56 are formed of metal which has a high heat transfer rate such as aluminum. Furthermore, the first pin 51, the second pin 52, the first sleeve 53, the second sleeve 54, the first screw 55, and the second screw 56 are in contact with the case 11 of the image capturing device 10 and the heat-dissipation part 40. By virtue of this, the first pin 51, the second pin 52, the first sleeve 53, the second sleeve 54, the first screw 55, and the second screw 56 can transmit the heat of the case 11 of the image capturing device 10 to the heat-dissipation part 40. Therefore, the image capturing device 10 is cooled by the heat-dissipation part 40.

Figure 4:
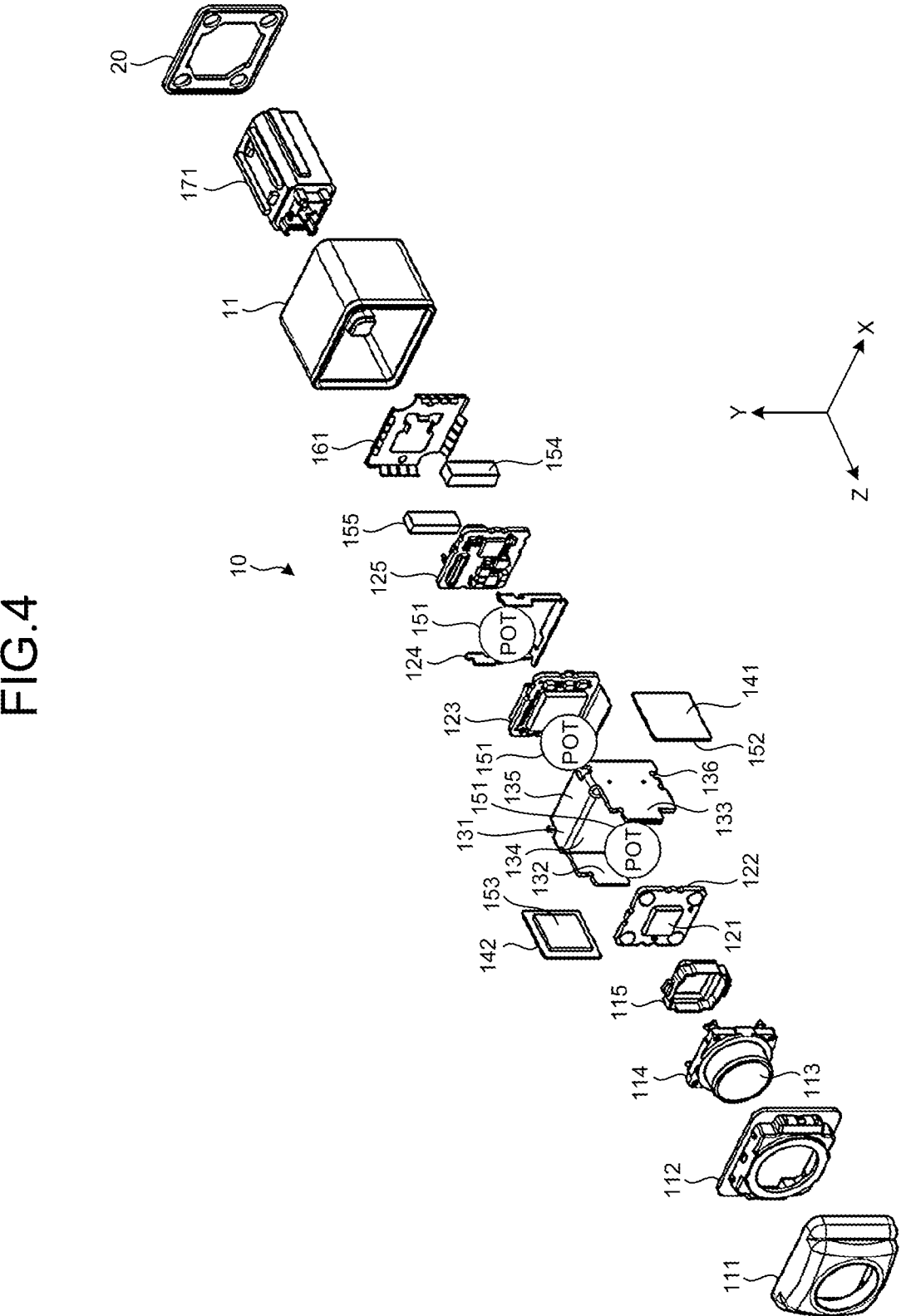
FIG. 4 is an exploded perspective view illustrating an example of an exploded state of an image capturing device according to the first embodiment.
Figure 5:
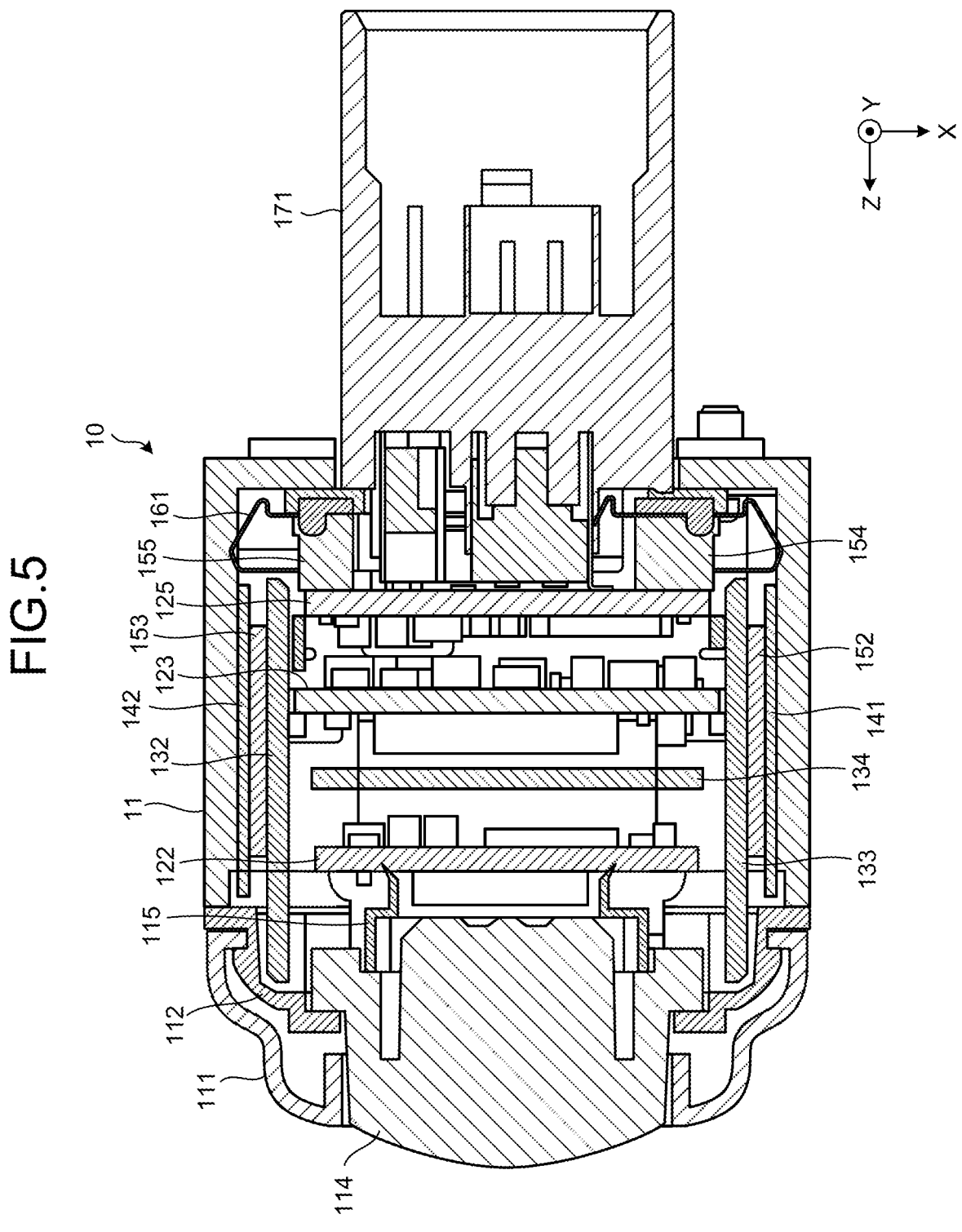
FIG. 5 is a cross-sectional view illustrating an example of a sectioned state of the image capturing device according to the first embodiment.

Next, the image capturing device 10 will be described. FIG. 4 is an exploded perspective view illustrating an example of an exploded state of the image capturing device 10 according to the first embodiment. FIG. 5 is a cross-sectional view illustrating an example of a sectioned state of the image capturing device 10 according to the first embodiment.

The image capturing device 10 is provided with a front-face cap 111, a lens bracket 112, a lens unit 114, a dust-tight rubber 115, a sensor board 122, a heat spreader 131, a first side heat-dissipation plate 141, a first heat-dissipation sheet 152, a second side heat-dissipation plate 142, a second heat-dissipation sheet 153, a main board 123, a board supporting portion 124, a rear-face board 125, a first rear-face heat-dissipation sheet 154, a second rear-face heat-dissipation sheet 155, a rear-face shield 161, the case 11, and the rear-face connector 171.

The front-face cap 111 is a cover which covers a front face of the image capturing device 10. More specifically, the front-face cap 111 is the cover which covers the periphery of the lens 113 of the image capturing device 10. The front-face cap 111 is formed of, for example, a resin.

The lens bracket 112 is a member which supports the lens 113. The lens bracket 112 is formed of, for example, a resin. Also, the lens bracket 112 is coupled to the lens unit 114 by laser welding. Furthermore, the lens bracket 112 is coupled to, by laser welding, a resin which is disposed at an edge of the front face of the case 11. By virtue of this, the lens bracket 112 improves the watertightness of the image capturing device 10.

The lens unit 114 is a member in which the lens 113 is attached to a seat. The dust-tight rubber 115 is a member which prevents dirt and dust from entering an optical path of the light which enters from the lens 113.

The sensor board 122 is a board to which an image sensor 121, which converts the light entered from the lens 113 into electric signals, is attached. The image sensor 121 generates images based on the light which has entered from the lens 113. The lens unit 114 is coupled to four corners of the sensor board 122 by an adhesive agent with the dust-tight rubber 115 interposed therebetween.

A heat-dissipation potting agent 151 is injected between the sensor board 122 and the heat spreader 131. The heat-dissipation potting agent 151 is resin having a high heat transfer rate and is material which hardens as time elapses when injected. By virtue of this, the sensor board 122 transmits heat to the heat spreader 131 via the heat-dissipation potting agent 151.

For example, the heat-dissipation potting agent 151 is a two-pack liquid. The heat-dissipation potting agent 151 enters gaps of parts since the agent is liquid although the agent has high viscosity immediately after two liquids are mixed. In other words, the heat-dissipation potting agent 151 enters without generating gaps. By virtue of this, the heat-dissipation potting agent 151 enhances the effect of heat dissipation. Then, when predetermined time elapses, the heat-dissipation potting agent 151 hardens.

The heat spreader 131 spreads generated heat onto the case 11. For example, the heat spreader 131 spreads the heat, which has been generated by, for example, the sensor board 122, the main board 123, and the rear-face board 125, onto, for example, the case 11. In more detail, the heat spreader 131 is formed of metal having a high heat transfer rate such as aluminum.

The heat spreader 131 has a first opposed plate 132 and a second opposed plate 133 opposed in the X-axis direction. Also, the heat spreader 131 has a central plate 134, which is approximately parallel to the Y-axis direction, at approximately the center of the first opposed plate 132 and the second opposed plate 133 in the Z-axis direction. Also, the heat spreader 131 has a first rear-face plate 135, which extends from an upper end of the central plate 134 to rear side ends of the first opposed plate 132 and the second opposed plate 133. Also, the heat spreader 131 has a second rear-face plate 136, which extends from a lower end of the central plate 134 to rear side ends of the first opposed plate 132 and the second opposed plate 133.

The first side heat-dissipation plate 141 and the second side heat-dissipation plate 142 are disposed between the heat spreader 131 and the case 11. The first side heat-dissipation plate 141 and the second side heat-dissipation plate 142 are formed of metal having a high heat transfer rate such as aluminum. In other words, the first side heat-dissipation plate 141 and the second side heat-dissipation plate 142 are formed of a metal and disposed between the heat spreader 131 and the case 11. The first side heat-dissipation plate 141 and the second side heat-dissipation plate 142 are examples of heat-dissipation plates. The first side heat-dissipation plate 141 and the second side heat-dissipation plate 142 transmit the heat of the heat spreader 131 to the case 11.

In more detail, the first side heat-dissipation plate 141 is disposed on the right side of the heat spreader 131 when viewed from the front side in which the lens 113 is disposed. Also, the second side heat-dissipation plate 142 is disposed on the left side of the heat spreader 131 when viewed from the front side in which the lens 113 is disposed.

The first heat-dissipation sheet 152 and the second heat-dissipation sheet 153 are sheet-like members which have elasticity and are formed of a resin having comparatively high heat conductivity. The first heat-dissipation sheet 152 is disposed between the heat spreader 131 and the first side heat-dissipation plate 141. The first heat-dissipation sheet 152 transmits the heat of the heat spreader 131 to the first side heat-dissipation plate 141. The second heat-dissipation sheet 153 is disposed between the heat spreader 131 and the second side heat-dissipation plate 142. The second heat-dissipation sheet 153 transmits the heat of the heat spreader 131 to the second side heat-dissipation plate 142. In other words, the first heat-dissipation sheet 152 and the second heat-dissipation sheet 153 are disposed between the heat spreader 131 and the first side heat-dissipation plate 141 or the second side heat-dissipation plate 142, have elasticity, and transmit the heat of the heat spreader 131 to the first side heat-dissipation plate 141 or the second side heat-dissipation plate 142.

Herein, the spreading of heat by the heat spreader 131 will be described.

Air has comparatively low heat conductivity. Therefore, it is preferred that no gap is present between the heat spreader 131 and the case 11. However, minute irregularities are generated on the surfaces of the heat spreader 131 and the case 11. Furthermore, in order to cause the heat spreader 131 and the case 11 to contact each other, highly precise shaping has to be carried out so that the inner diameter of the case 11 and the outer diameter of the heat spreader 131 match.

Therefore, the first heat-dissipation sheet 152 and the second heat-dissipation sheet 153 are disposed between the heat spreader 131 and the case 11. Since the first heat-dissipation sheet 152 and the second heat-dissipation sheet 153 are elastic bodies, gaps can be filled even if there are errors between the inner diameter of the case 11 and the outer diameter of the heat spreader 131. Thus, the shaping precision desired for the first heat-dissipation sheet 152 and the second heat-dissipation sheet 153 can be suppressed.

However, the first heat-dissipation sheet 152 and the second heat-dissipation sheet 153 are thin elastic bodies. Therefore, if the first heat-dissipation sheet 152 and the second heat-dissipation sheet 153 are inserted to the case 11 without disposing the first side heat-dissipation plate 141 and the second side heat-dissipation plate 142, the first heat-dissipation sheet 152 and the second heat-dissipation sheet 153 are bent.

Therefore, the first side heat-dissipation plate 141 is disposed between the first heat-dissipation sheet 152 and the case 11. Also, the second side heat-dissipation plate 142 is disposed between the second heat-dissipation sheet 153 and the case 11. The first side heat-dissipation plate 141 and the second side heat-dissipation plate 142 are hard plates which are made of a metal such as aluminum. Therefore, by carrying out the insertion to the case 11 after disposing the first side heat-dissipation plate 141 and the second side heat-dissipation plate 142, the first side heat-dissipation plate 141 and the second side heat-dissipation plate 142 can suppress bending of the first heat-dissipation sheet 152 and the second heat-dissipation sheet 153.

In this manner, the heat spreader 131 realizes suppression of the difficulty to create the image capturing device 10 and spreading of heat by the heat spreader 131. Moreover, the heat spreader 131 can efficiently transmit heat to the case 11 via the first heat-dissipation sheet 152, the second heat-dissipation sheet 153, the first side heat-dissipation plate 141, and the second side heat-dissipation plate 142.

Also, the heat-dissipation potting agent 151 is injected between the heat spreader 131 and the main board 123. By virtue of this, the sensor board 122 transmits heat to the heat spreader 131 via the heat-dissipation potting agent 151.

The main board 123 is a main board of the image capturing device 10. For example, the main board 123 has a processor such as an Image Signal Processor (ISP), which processes images acquired from sensors. For example, ISP executes processing of detecting humans and objects. Also, the main board 123 has, for example, a power-supply Integrated Circuit (IC), which controls power supply of the image capturing device 10. Also, the main board 123 is coupled to the sensor board 122 by a flexible board, which has flexibility and can be bent.

The board supporting portion 124 fixes the position of the main board 123 and maintains space between the main board 123 and the rear-face board 125. Also, the board supporting portion 124 is fixed to a particular position by being caught by the heat spreader 131. Herein, the sensor board 122 and the main board 123 are coupled to each other by the flexible board. The flexible board has elasticity. Therefore, if the main board 123 is not fixed to a particular position, the main board 123 is flipped up by the flexible board. Therefore, the board supporting portion 124 fixes the main board 123 to the particular position.

Furthermore, if electronic components on the main board 123 and electronic components on the rear-face board 125 contact each other, failure may occur. Therefore, the board supporting portion 124 maintains the space between the main board 123 and the rear-face board 125.

Also, the heat-dissipation potting agent 151 is injected between the main board 123 and the rear-face board 125. In other words, the heat-dissipation potting agent 151 is injected to the space maintained by the board supporting portion 124. By virtue of this, the rear-face board 125 transmits heat to the heat spreader 131 via the heat-dissipation potting agent 151.

The rear-face board 125 is a board which is disposed on the rear side of the main board 123. The rear-face board 125 has, for example, a power-supply IC and an IC which executes serialization of data. Also, the rear-face board 125 is coupled to the main board 123, for example, by a board-to-board connector.

The first rear-face heat-dissipation sheet 154 and the second rear-face heat-dissipation sheet 155 are the members which transmit the heat generated in the rear-face board 125 to, for example, the case 11. For example, the first rear-face heat-dissipation sheet 154 and the second rear-face heat-dissipation sheet 155 are formed of, for example, resin having comparatively high heat transfer rate. Note that, in the image capturing device 10, the heat-dissipation potting agent 151 may be injected instead of the first rear-face heat-dissipation sheet 154 and the second rear-face heat-dissipation sheet 155. In such a case, the heat-dissipation potting agent 151 transmits the heat.

The rear-face shield 161 electrically connects the rear-face connector 171 and the case 11 to each other.

The rear-face connector 171 is connected to ground of a harness. Also, the rear-face connector 171 is connected to the case 11. In other words, the rear-face connector 171 connects the sensor board 122, the main board 123, the rear-face board 125, etc. to the ground of the harness via the case 11 and the rear-face shield 161.

As described above, the image capturing unit 1 according to the present disclosure is provided with the image capturing device 10 which has the case 11 formed of metal having a high heat transfer rate such as aluminum, the bracket 30 which supports the image capturing device 10 and couples the image capturing device 10 to the vehicle, and the heat-dissipation part 40. The case 11 and the heat-dissipation part 40 are coupled to each other by the first pin 51, the second pin 52, the first sleeve 53, the second sleeve 54, the first screw 55, and the second screw 56 formed of metal having a high heat transfer rate such as aluminum. By virtue of this, the heat generated in the image capturing device 10, etc. is transmitted to the heat-dissipation part 40. Therefore, the image capturing unit 1 can efficiently dissipate the heat generated in the image capturing device 10, etc.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An image capturing unit comprising:
a camera comprising a metal case having a side wall that includes an inner surface and an outer surface opposite to the inner surface;
a bracket formed of resin and configured to support the camera;
a heat-dissipation part disposed on a rear side of the camera and configured to dissipate heat of the camera; and
a coupling part formed of metal and configured to couple the case of the camera and the heat-dissipation part to each other,
wherein:
the camera includes:
a heat spreader configured to spread generated heat onto the case;
at least one heat-dissipation plate formed of metal and disposed between the heat spreader and the case; and
at least one heat-dissipation sheet disposed between the heat spreader and the at least one heat-dissipation plate, having elasticity, and configured to transmit the heat of the heat spreader to the at least one heat-dissipation plate,
at least a portion of the heat spreader contacts the at least one heat-dissipation sheet,
at least a portion of the at least one heat-dissipation sheet contacts the at least one heat-dissipation plate, and
at least a portion of the at least one heat-dissipation plate contacts the inner surface of the side wall of the case.

2. The image capturing unit according to claim 1, wherein the bracket includes a recessed portion in which the camera fits, and
the heat-dissipation part is disposed at a position corresponding to the recessed portion.

3. The image capturing unit according to claim 1, wherein the coupling part couples the case of the camera and the heat-dissipation part by one or more screws and one or more pins disposed on a diagonal line of a surface which couples the case and the heat-dissipation part.

4. The image capturing unit according to claim 2, wherein the coupling part couples the case of the camera and the heat-dissipation part by one or more screws and one or more pins disposed on a diagonal line of a surface which couples the case and the heat-dissipation part.

5. The image capturing unit according to claim 4, wherein the one or more screws includes a first screw and a second screw, and
the one or more pins includes a first pin and a second pin.

6. The image capturing unit according to claim 5, wherein the camera includes a first sleeve and a second sleeve,
the recessed portion of the bracket includes a first hole, a second hole, a third hole and a fourth hole, and
the first pin is inserted in the first hole of the recessed portion, the second pin is inserted in the second hole of the recessed portion, the first sleeve is inserted in the third hole of the recessed portion, and the second sleeve is inserted in the fourth hole of the recessed portion.

7. The image capturing unit according to claim 1, wherein the camera further includes:
a lens unit; and
at least one board disposed in the case.

8. An image capturing unit comprising:
a camera comprising a metal case;

a bracket formed of resin and configured to support the camera;

a heat-dissipation part disposed on a rear side of the camera and configured to dissipate heat of the camera; and a coupling part formed of metal and configured to couple the case of the camera and the heat-dissipation part to each other, wherein the coupling part couples the case of the camera and the heat-dissipation part by one or more screws and one or more pins disposed on a diagonal line of a surface which couples the case and the heat-dissipation part.

9. The image capturing unit according to claim 8, wherein the bracket includes a recessed portion in which the camera fits, and the heat-dissipation part is disposed at a position corresponding to the recessed portion.

10. The image capturing unit according to claim 8, wherein the camera includes:

a heat spreader configured to spread generated heat onto the case;

a heat-dissipation plate formed of metal and disposed between the heat spreader and the case; and a heat-dissipation sheet disposed between the heat spreader and the heat-dissipation plate, having elasticity, and configured to transmit the heat of the heat spreader to the heat-dissipation plate.

11. The image capturing unit according to claim 9, wherein the one or more screws includes a first screw and a second screw, and the one or more pins includes a first pin and a second pin.

12. The image capturing unit according to claim 11, wherein the camera includes a first sleeve and a second sleeve, the recessed portion of the bracket includes a first hole, a second hole, a third hole and a fourth hole, and the first pin is inserted in the first hole of the recessed portion, the second pin is inserted in the second hole of the recessed portion, the first sleeve is inserted in the third hole of the recessed portion, and the second sleeve is inserted in the fourth hole of the recessed portion.

* * * * *